United States Patent [19]
Chang et al.

[11] Patent Number: 5,633,778
[45] Date of Patent: May 27, 1997

[54] INFRARED SIGNAL INTERFACE FOR USE WITH BARRIER DOOR OPERATOR

[75] Inventors: James S. Chang, Arlington Heights; Russell L. Powers, Willowbrook, both of Ill.

[73] Assignee: The Chamberlain Group, Inc., Elmhurst, Ill.

[21] Appl. No.: 510,637

[22] Filed: Jul. 31, 1995

Related U.S. Application Data

[63] Continuation of Ser. No. 187,858, Jan. 28, 1994, abandoned.

[51] Int. Cl.⁶ .................................................. E05F 15/20
[52] U.S. Cl. ........................ 361/173; 307/326; 318/286
[58] Field of Search ................................ 361/139, 160, 361/170, 173, 179, 195; 49/25–28; 250/221; 307/326, 328; 318/286

[56] References Cited

U.S. PATENT DOCUMENTS

| | | | |
|---|---|---|---|
| 4,922,168 | 5/1990 | Waggamon et al. | 318/386 |
| 5,079,417 | 1/1992 | Strand | 250/221 |
| 5,191,268 | 3/1993 | Duhame | 318/266 |
| 5,233,185 | 8/1993 | Whitaker | 250/221.1 |
| 5,285,136 | 2/1994 | Duhame | 318/266 |
| 5,357,183 | 10/1994 | Lin | 318/468 |
| 5,465,033 | 11/1995 | Fassih-Nia | 318/480 |

*Primary Examiner*—Fritz Fleming
*Attorney, Agent, or Firm*—Fitch, Even, Tabin & Flannery

[57] ABSTRACT

An infrared signal interface enables an infrared detector module to communicate with the door edge signal input of a garage door operator. The infrared signal interface has a power supply for driving the pulsed infrared detector. Pulsed signals are received by a missing pulse detector that controls a relay. The relay may be coupled to the door edge signal of the garage door operator.

6 Claims, 2 Drawing Sheets

INFRARED SIGNAL INTERFACE FOR USE WITH BARRIER DOOR OPERATOR

This application is a continuation of application Ser. No. 187,858 filed Jan. 28, 1994, now abandoned.

BACKGROUND OF THE INVENTION

The present invention relates to an infrared signal interface for translating an infrared detector signal into a standard garage door operator edge detection signal and, more particularly, relates to an infrared signal translator which is a separate module from the garage door operator and is powered thereby.

It is well known that automatic door operators can use ultrasonic or infrared sensors in conjunction therewith to control operation of a door.

Older garage door operators typically have a pair of screw type input terminals that are to be connected to a mechanical obstacle switch. The mechanical switch, when closed, provides a signal path between the two terminals which is interpreted by the garage door operator as indicating a fault condition or that an obstacle may have been encountered in the path of the door. The garage door operator then immediately reverses to lift the door away from the obstacle. The typical mechanical switch which would be used with the existing garage door operators is a door edge closure switch associated with a bottom edge of a door. The bottom edge of the door may have an extensible mechanical switch or may have an air or gas filled bladder extending therealong. The air or gas filled bladder, when coming into contact with an obstacle or the garage floor, is compressed by the door movement, raising the pressure within the bladder and causing the door edge switch to close. The drawback, however, of such a system is that it is relatively expensive to fit a mechanical door with a door edge detector. The door edge detector may wear out or may become damaged by punctures and the like. In particular, if the door edge detector has become defective, it may be desirable to replace it with a relatively low-cost system such as an infrared detector. Unfortunately, the infrared detector power supply requirements and signal characteristics are incompatible with the simple switch closure characteristics of door edge detectors and an optical detector could not be connected directly to the input terminals of the existing garage door operators which are meant to receive door edge closure signals.

What is needed is an apparatus for coupling an infrared or optical obstacle sensor to the door edge signal input terminals of existing garage door operators.

SUMMARY OF THE INVENTION

The instant invention relates to an infrared signal interface for use with a barrier or garage door operator system to be powered thereby and to receive infrared signals from a missing pulse infrared obstacle detector module coupled to an infrared emitter and an infrared detector pair.

The infrared signal interface may be coupled to the garage door operator system to receive 24 volt alternating current power therefrom. A power supply within the infrared signal interface system produces regulated 5 volt and 17 volt power. The 17 volt power is provided across a pair of infrared detector output pins to supply power to an infrared detector module that is coupled thereto. The missing pulse infrared detector module periodically sends pulses back except when the infrared beam between the emitter and the detector is interrupted or is missing due to failure. At that point, the signal from the infrared module becomes a steady state signal. The pulsatile or steady state signal is received back through the same input pair by the interface and is fed to a timer circuit comprising a monostable multivibrator. If the pulses are missing for a predetermined portion of the time, indicating an obstacle or a failure, usually 20 milliseconds or more, the multivibrator produces a missing pulse signal which is fed through a Darlington pair. The Darlington pair then causes a D.C. relay to be energized, shorting a pair of signal output contacts, which shorted signal output contacts simulate a door edge closure. The output contacts are connected to the garage door operator. Thus, when the infrared obstacle detector is blocked, the interface receives the signals and outputs a shorted signal having the same characteristics as the prior door edge closure signals to the garage door operator. The garage door operator then takes independent action to raise the door or the like in order to avoid having the door touch the obstacle.

It is a principal aspect of the present invention to provide an interface circuit for coupling an infrared detector system to a garage door operator. It is another aspect of the instant invention to provide an interface system which can translate infrared detector signals to a garage door operator door edge closure signal.

Other aspects of the invention will become obvious to one of ordinary skill in the art upon a perusal of the following specification and claims in light of the accompanying drawings.

DETAILED DESCRIPTION OF THE PREFERRED EMBODIMENT

Figure 1:
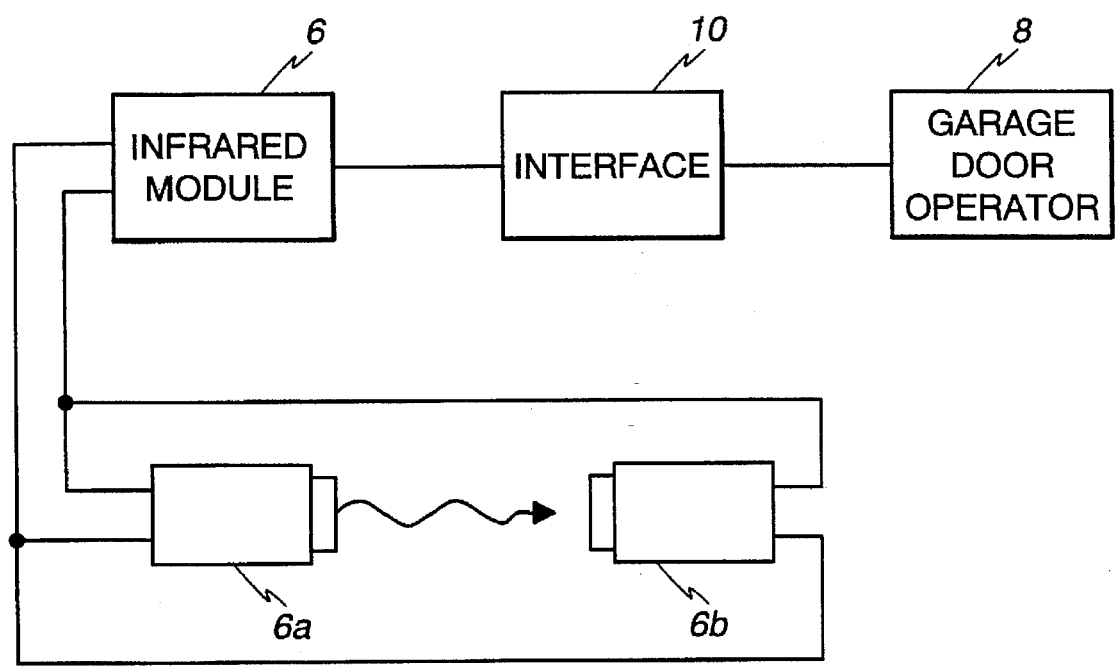
FIG. 1 is a block diagram of a garage door operator system retrofitted with an infrared detector module via an apparatus embodying the present invention.

Referring now to FIG. 1, an infrared obstacle detector module 6 having an infrared emitter 6a and an infrared detector 6b connected thereto and a barrier or garage door operator system 8 are coupled together by an infrared signal interface 10 embodying the present invention. The garage door operator 8 may be a Model HT, HJ, GT, GJ, MT or MJ unit available from The Chamberlain Group, Inc. of Elmhurst, Ill.

Figure 2:
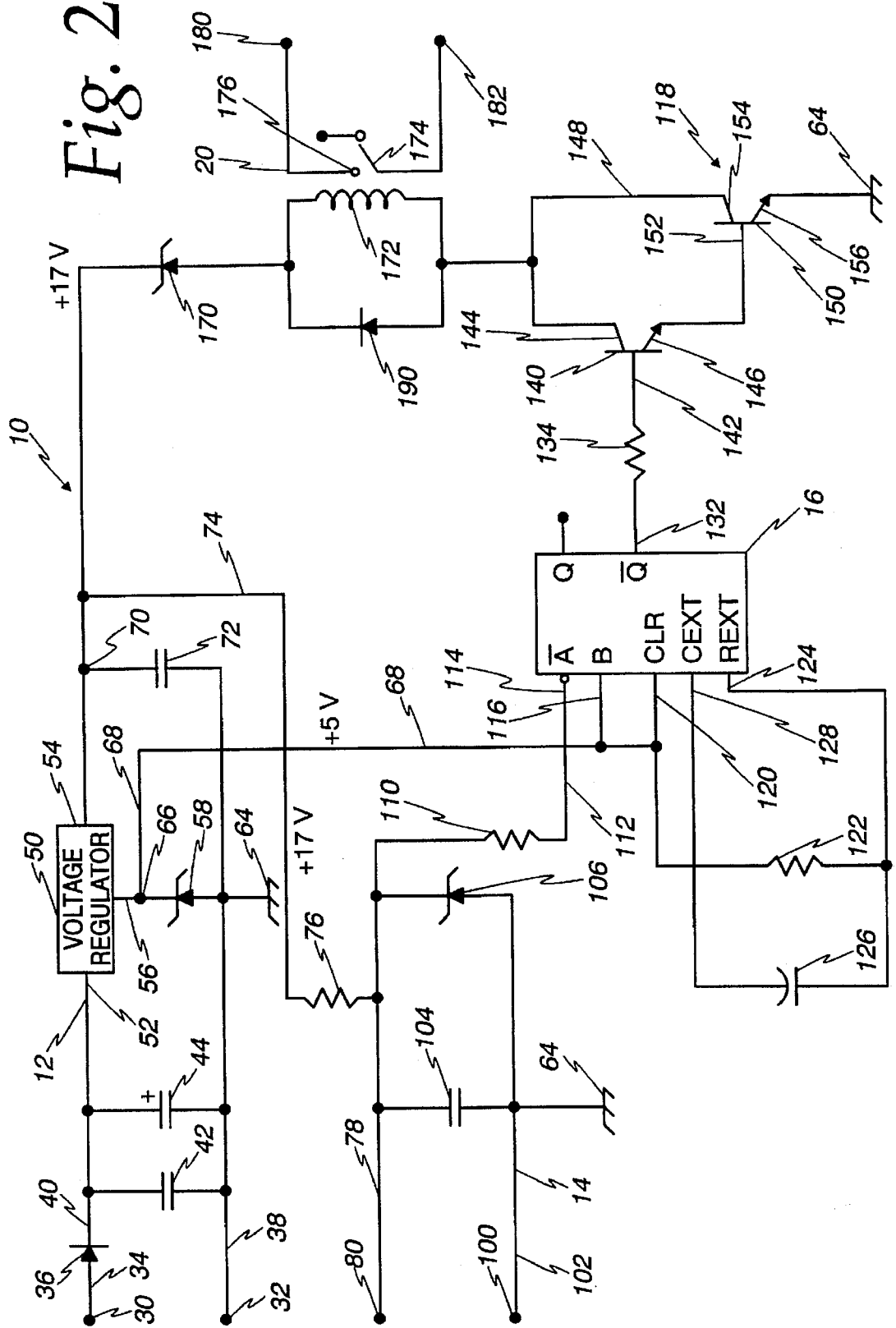
FIG. 2 is a schematic diagram of the interface apparatus shown in FIG. 1.

As shown in FIG. 2, the infrared signal interface 10 has means for providing power to the infrared obstacle detector module 6 that comprises a power supply 12 coupled to provide power to an infrared module driver and receiver 14 for sending A.C. power to and receiving pulsed infrared signals from the infrared obstacle detector module 6. Detector module 6 is connected to a missing pulse detector or timer 16 which provides a missing pulse signal that drives a Darlington output driver 18 to control a relay 20. 24 volt alternating current power is received from the garage door operator 8 at a pair of power input pins 30 and 32. The pin 30 feeds the 24 volt A.C. signals over a lead 34 to a diode 36 connected as a half wave rectifier. The pin 32 is connected to a lead 38. The diode 36 feeds a lead 40 which has connected across it a 0.1 microfarad filter capacitor 42 and a 100 microfarad electrolytic filter capacitor 44. The capacitors 42 and 44 remove transients from the half wave rectified voltage on the lead 40. The lead 40 is connected to a 7812 CTH voltage regulator 50 at an input pin 52. The voltage regulator 50 also has a pair of output pins 54 and 56. The pin 56 is strapped through a reverse biased 5.1 volt Zener diode 58 to lead 38 which is grounded at a ground 64. A node 66 is provided at pin 56 to which a lead 68 is connected which may tap off a 5 volt regulated signal to be supplied to the multivibrator 16. The output pin 54 has a lead 70 connected to it and a 0.1 microfarad filter capacitor 72 is connected between the lead 70 and the lead 38 to conduct transients away from the lead 70. The lead 70 has a lead 74 connected to it. Both the lead 70 and the lead 74 have a +17 volt supply thereon.

The lead 74 provides regulated 17 volt D.C. power through a 470 ohm, 2 watt resistor 76 to a lead 78 which is connected to a first infrared connector 80. The infrared connector 80 is connected to the infrared module 6 which has an infrared emitter 6a and the infrared receiver 6b connected thereto. A pin 100 is connected to a lead 102. A 39 picofarad capacitor 104 is connected across leads 78 and 102 to conduct very high frequency transients away from the lead 78. It should be appreciated that the lead 102 is also grounded at a ground 64. A reverse biased 6.0 volt Zener diode 106 is connected in parallel with the capacitor 104. It may be appreciated that both the infrared emitter which generates infrared radiation which may be placed across an obstacle, such as a garage door or the like, and the infrared detector are energized by the 17 volt signal and have a current return path out of pin 80 and back through pin 100. The 17 volt driver voltage is fed through a 100 kilohm resistor 110 connected to the lead 78 and to a lead 112 which is connected to the multivibrator 16. The multivibrator 16, in this instance, is a 74HC123 having the lead 112 connected at its $\overline{A}$ pin 114. The B pin 116 is strapped high with the 5 volt signal from the lead 68 to which it is connected. Likewise, a CLR pin 120 is also strapped high by the plus 5 volt signal. The 5 volt signal is fed to a 100 kilohm resistor 122 which is connected from the clear pin 120 to an REXT pin 124. A 0.1 microfarad capacitor 126 is connected between a CEXT pin 128 and the REXT pin 124 to forman RC timer circuit. When the beam is interrupted, the signal level through resistor 110 changes and becomes steady, indicating missing pulses, causing the timer represented by the resistor 122 and capacitor 126 to begin running, and if the beam is not subsequently cleared as evidenced by the pulses being missing, within the time interval which is about equal to twenty milliseconds, the $\overline{Q}$ pin 132 of the multivibrator is pulled high.

This provides drive current through a 4.7K resistor 134 to a Darlington pair 118 consisting of a first NPN transistor 140 and a second NPN transistor 150. Transistor 140 has a base 142 connected to the resistor 134 to receive the drive current therefrom. A collector 144 is connected to a lead 148. An emitter 146 is connected to the second NPN transistor 150 at a base 152. The collector 154 of the second NPN transistor 150 is also connected to lead 148, and the second NPN transistor 150 has a grounder emitter 156. Driving the base 142 of the transistor 140 high switches the transistor 140 ON providing base drive to the transistor 150 that switches it on. This provides a grounded connection for current supplied on the lead 70 through the relay 20. More specifically, the voltage drop through the relay 20 is limited to a total of about 5 volts by a 12 volt reversed-biased Zener diode 170 connected to the lead 70 and to the relay 20. The relay 20 includes a relay coil 172 and an armature 174 movable by the coil into contact with a contact 176 to effect closure between a pair of output pins 180 and 182 connected thereto. Damage to the coil 172 is avoided by placing a reverse-biased diode 190 in parallel with the coil to absorb transients when the field collapses when the coil is de-energized. The coil signal is thus representative of what would normally be a door edge closure signal due to a door edge switch. Thus, when the light beam is interrupted, the multivibrator times out causing the relay to close and providing a shorted circuit path which simulates a door edge closure to the garage door operator 8 which has its door edge detector inputs connected to the pins 180 and 182.

While there has been illustrated and described a particular embodiment of the present invention, it will be appreciated that numerous changes and modifications will occur to those skilled in the art, and it is intended in the appended claims to cover all those changes and modifications which fall within the true spirit and scope of the present invention.

What is claimed:

1. An infrared signal interface for translating infrared signals from an infrared obstacle detector into an edge detector obstacle signal for a barrier door operator having edge detector leads, comprising:

means for providing power to the infrared obstacle detector;

means for receiving pulsed infrared signals indicative of both proper functioning of the infrared obstacle detector and detection of no obstacle by the infrared obstacle detector;

timer means responsive to said infrared signal pulses for providing a missing pulse output signal when said infrared signal pulses are absent for a predetermined time; and circuit closure means responsive to said missing pulse output signal for closing a current path between the edge detector leads of the barrier door operator.

2. An infrared signal interface as defined in claim 1, wherein said timer means comprises a monostable multivibrator.

3. An infrared signal interface as defined in claim 1, wherein said circuit closure means comprises a relay.

4. An infrared signal interface as defined in claim 3, wherein said timer means comprises a monostable multivibrator.

5. An infrared signal interface according to claim 4, wherein said circuit closure means further comprises a Darlington pair responsive to the missing pulse output signal for closing said relay.

6. An infrared signal interface according to claim 5, wherein said power supply comprises:

power input pins for receiving alternating current power, a multiple output voltage regulator for converting alternating current power into direct current power, and power output pins for providing direct current power.

* * * * *